United States Patent
Hamada et al.

(10) Patent No.: US 7,397,322 B2
(45) Date of Patent: Jul. 8, 2008

(54) RADIATION NOISE SUPPRESSION CIRCUIT FOR DIFFERENTIAL TRANSMISSION LINE

(75) Inventors: Seiji Hamada, Osaka (JP); Hirotsugu Fusayasu, Kyoto (JP); Shinichi Tanimoto, Kyoto (JP); Ryo Matsubara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 138 days.

(21) Appl. No.: 11/297,740

(22) Filed: Dec. 8, 2005

(65) Prior Publication Data

US 2006/0125571 A1    Jun. 15, 2006

(30) Foreign Application Priority Data

Dec. 10, 2004    (JP)    ............................ 2004-358923

(51) Int. Cl.
*H04B 3/28*    (2006.01)
*H03H 7/00*    (2006.01)

(52) U.S. Cl. ......................................... 333/12; 333/181
(58) Field of Classification Search ..................... 333/12
See application file for complete search history.

(56) References Cited

U.S. PATENT DOCUMENTS

| 4,751,607 | A | | 6/1988 | Smith |
| 5,113,159 | A | * | 5/1992 | Adriaenssens et al. ........ 333/12 |
| 5,726,611 | A | | 3/1998 | Takagi et al. |
| 5,825,259 | A | * | 10/1998 | Harpham ................... 333/22 R |
| 6,677,829 | B2 | * | 1/2004 | Maki et al. ................ 333/22 R |
| 2002/0117318 | A1 | | 8/2002 | Susuki |
| 2004/0155720 | A1 | * | 8/2004 | Yasui et al. .................... 333/12 |

FOREIGN PATENT DOCUMENTS

| JP | 54-032215 | | 3/1979 |
| JP | 5-65156 | | 8/1993 |
| JP | 07-106138 | | 4/1995 |
| JP | 2000-058343 | | 2/2000 |
| JP | 2001007458 A | * | 1/2001 |
| JP | 2004165448 A | * | 6/2004 |

* cited by examiner

*Primary Examiner*—Benny Lee
*Assistant Examiner*—Eric R Hamill
(74) *Attorney, Agent, or Firm*—RatnerPrestia

(57) ABSTRACT

A radiation noise suppression circuit for a differential transmission line includes a differential transmission line which has plus line signal wiring to which a plus line signal of a differential signal is applied, and minus line signal wiring to which a minus line signal of the differential signal is applied, and connects a differential driver and a differential receiver. Plus line signal GND wiring and minus line signal GND wiring which are connected between the differential driver and the differential receiver are wired along the differential transmission line. A distance between the plus line signal wiring and the plus line signal GND wiring is substantially equal to a distance between the minus line signal wiring and the minus line signal GND wiring.

5 Claims, 6 Drawing Sheets

Fig. 9 (a) PRIOR ART
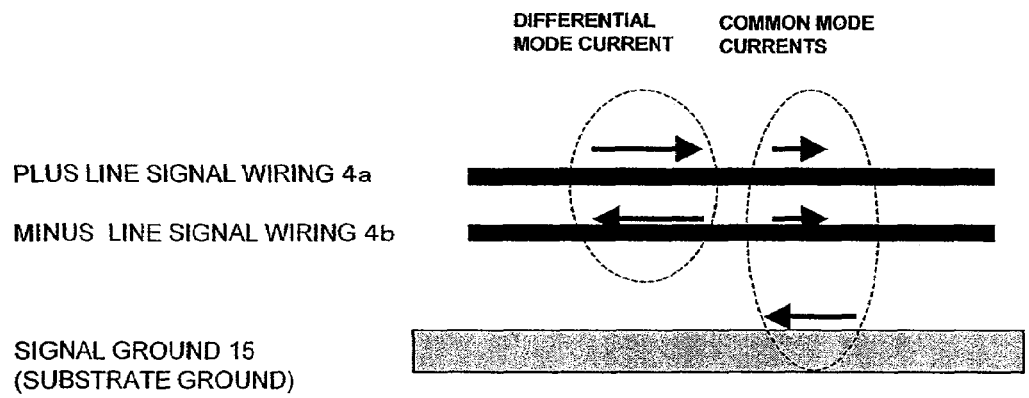
Fig. 9 (b) PRIOR ART
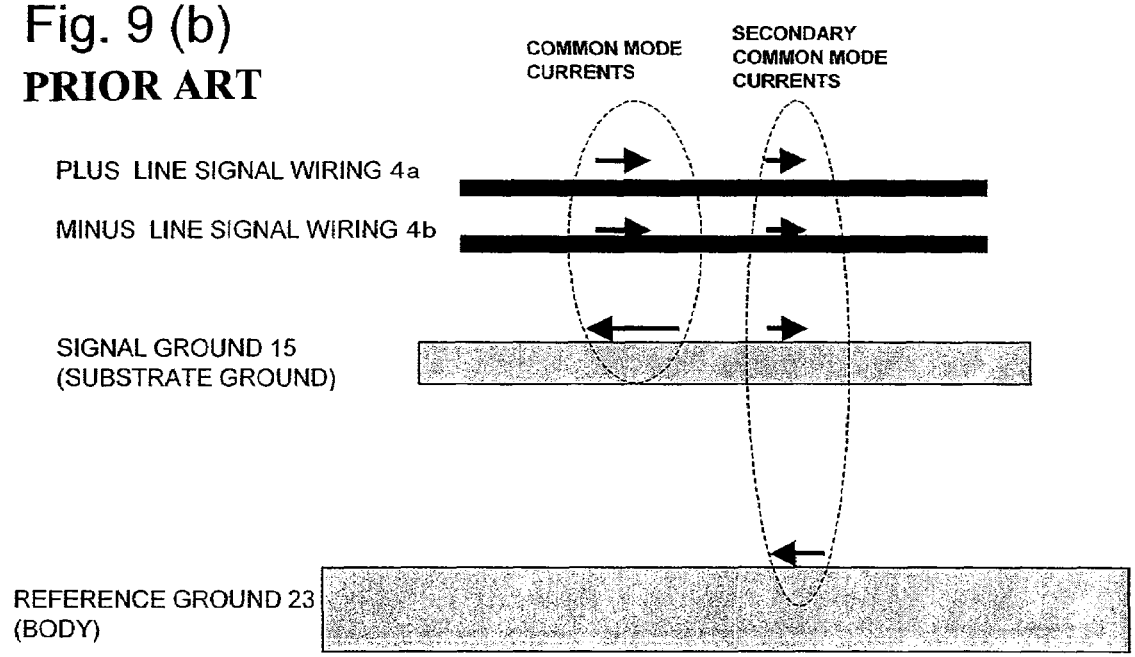

RADIATION NOISE SUPPRESSION CIRCUIT FOR DIFFERENTIAL TRANSMISSION LINE

BACKGROUND OF THE INVENTION

1. Field of the Invention

The present invention relates to a radiation noise suppression circuit in a differential transmission line which is one of high-speed signal transmission systems.

2. Related Art of the Invention

Recently, in flat-panel displays represented by liquid crystal TV sets and plasma TV sets, acceleration of signal speed at the time of transferring image information has progressed as it has become high definition from VGA (video Graphics Array) to XGA (eXtended Graphics Array). Then, a differential transmission system in low amplitude has been used increasingly as a high-speed digital data transmission system.

This transmission system is a transmission system which sends signals with opposite phases mutually through one pair of balanced cables or two wiring patterns formed on a printed wiring board. Its features are low noise, low voltage amplitude, high-speed data transmission, and the like, and its introduction has been progressing in a field of displays as a high-speed transmission method.

FIG. 6 is a structural diagram showing an example of a differential transmission line using an LVDS (Low Voltage Differential Signaling) system which is one of general differential transmission systems.

In FIG. 6, a plus line signal wiring 4a and a minus line signal wiring 4b whose differential impedance is 100 Ω connect a differential driver 1 and a differential receiver 2, and are terminated by a 100-Ω terminating resistor 3 near an input terminal of the differential receiver 2. Since signals with the same amplitude but opposite phases are applied to the two signal wiring 4a and 4b respectively, magnetic fields generated from the respective signal wiring 4a and 4b cancel each other, and hence, radiation noise hardly generates.

However, in actual differential transmission, since there is a skew, i.e., difference between rise time and fall time in signals outputted from the differential driver 1, a common mode current flowing with making the two signal wiring 4a and 4b outward circuits, and making a signal ground 15 a return circuit arises, and becomes a factor of the radiation noise. Here, the signal ground 15 shown in FIG. 6 means, for example, a GND plane formed on a printed wiring board, or the like.

There is a method using a common mode choke 10 as means of coping with the radiation noise resulting from this common mode current, as shown in FIG. 7.

Since the common mode choke 10 has the structure that the two signal wiring 4a and 4b are wound in the same direction around the same core, magnetic fields cancels each other in regard to signal component currents which flow in reverse directions mutually, and those signal component currents are passed. Nevertheless, since magnetic fields are added in regard to the common mode noise components, which flow in the same direction, to increase each other, it has impedance property, and hence, it has property of making the common mode current hard to flow through.

However, when the common mode choke 10 is used to be inserted at some points in the signal wiring 4a and 4b, characteristic impedances of the signal wiring 4a and 4b differ at the insertion points. Then, signals transmitted on the signal wiring 4a and 4b are reflected by the common mode choke 10, and transmitted signal waveforms are distorted. A common mode choke coil which suppresses the reflection at the insertion points of this common mode choke 10 to prevent the distortion of the transmitted signal waveforms is also proposed (for example, refer to Japanese Patent Laid-Open No. 2000-58343).

FIG. 8(a) is a perspective view showing appearance of the common mode choke coil disclosed in Japanese Patent Laid-Open No. 2000-58343, and FIG. 8(b) shows an exploded perspective view of the common mode choke coil, respectively.

This common mode choke coil is constituted of coil conductors 22a and 22b being bifilar-wound a ring-shaped toroidal core 20 made of ferrite, and this toroidal core 20 being contained in an armor case constituted of a lid unit 16 and a case unit 21.

The case unit 21 is constituted of a cylindrical inner circumferential wall 21a and an outer circumferential wall 21b being joined with a bottom wall 21c, and has a ring-shaped containing unit 21d for containing the toroidal core 20 inside. The lid unit 16 is disc-shaped and blocks up the containing unit 21d of the case unit 21. And, four claws 16b are drawn out at equal intervals from a marginal portion of the lid unit 16 along an outer side face of the outer circumferential wall 21b of the case unit 21.

A ground conductor 17 which is constituted of a chromium plating membrane and the like is formed on an outer side face of the outer circumferential wall 21b and the outside face of the bottom wall 21c of the case unit 21, and the outside face of the lid unit 16. On the ground conductor 17 of the outer circumferential wall 21b and the bottom wall 21c of the case unit 21, four locations of insulating layers 18 which are made of a resin which has insulation property, or the like are formed at equal intervals. On the insulating layers 18, terminal plates 19 which are made of a metal material such as phosphor bronze are mounted, respectively. End portions of the coil conductors 22a and 22b are soldered to these four terminal plates 19, respectively.

The lid unit 16 is fixed to the case unit 21 by making their claws 16b catch the bottom wall 21c of the case unit 21 together.

The common mode choke coil constituted in this way is used as the common mode choke 10 in FIG. 7 by the signal wiring 4a and 4b being connected to the terminal plates 19 respectively. Then, since the grounded ground conductor 17 faces the coil conductors 22a and 22b with sandwiching the armor case which is constituted of the lid unit 16 and case unit 21, electrostatic capacity (distributed capacity) which uses the armor case as a dielectric is formed among these. An LC distributed constant circuit is formed between each of the coil conductors 22a and 22b and a ground by this electrostatic capacity and inductor which the coil conductors 22a and 22b have. This electrostatic capacity is determined by a dielectric constant of the resin which constitutes the armor case, and a facing area and a distance of the ground conductor 17 and coil conductors 22a and 22b. Hence, it is possible to make characteristic impedance between each of the coil conductors 22a and 22b and the ground coincide with characteristic impedance between each of the signal wiring 4a and 4b and the ground by selecting adequately these values. Thus, it is possible to suppress reflection of the signal in the common mode choke 10.

Nevertheless, in high-speed transmission in recent years, even if the common mode choke 10 is used like the conventional, a sufficient noise reduction effect is no longer obtained.

As a factor, it has turned out that not only the common mode currents flowing with making the two signal wiring 4a and 4b outward circuits, and making the signal ground 15 a return circuit, but secondary common mode currents flowing in the same direction on the two signal wiring 4a and 4b and signal ground 15 are a noise factor. In regard to the noise resulting from this secondary common mode current, the conventional common mode choke 10 cannot produce a sufficient reduction effect.

Secondary common mode currents will be explained using FIG. 9. FIG. 9(a) is an explanatory diagram about common mode currents, and FIG. 9(b) is an explanatory diagram about the secondary common mode currents. Here, the case that the two signal wiring 4a and 4b which form a differential transmission line are formed on a printed wiring board will be explained as an example. In addition, the same reference numerals are used for the same components as those in FIG. 6.

FIG. 9(a) is a drawing showing a flow of the differential mode current and common mode currents in differential transmission. What flow in reverse directions between the signal wiring 4a and 4b are differential mode currents, and when respective signal wiring 4a and 4b are in complete equilibrium (distances from the signal ground 15 are the same, the width of the two signal wiring 4a and 4b are equal, and the like) to the signal ground 15, common mode currents are not generated.

However, when some unbalance (difference in width, difference in length, or the like) exists between the two signal wiring 4a and 4b, the common mode currents which flow in the same direction between the two signal wiring 4a and 4b as shown in FIG. 9(a) are generated.

FIG. 9(b) is a drawing showing generation of the secondary common mode currents resulting from discontinuity of the signal ground 15. A reference ground 23 provides a reference potential of the signal ground 15, and it is assumed that an enclosure provides a reference potential of the ground (signal ground 15) of the printed wiring board here.

In consideration of what is similar to the two signal wiring 4a and 4b in differential transmission in FIG. 9(a), currents flowing with making the two signal wiring 4a and 4b outward circuits, and making the signal ground 15 a return circuit are common mode currents. Then, when unbalance (width of the signal ground 15 is discontinuous, or the like) exists in them, the secondary common mode currents which flows through the two signal wiring 4a and 4b and signal ground 15 in the same direction as shown in FIG. 9(b) flow as a next mode.

The present invention aims at providing the radiation noise suppression circuit of the differential transmission line which solves the conventional subject mentioned above, does not deteriorate the reduction effect of conventional primary common mode current, and can reduce secondary common mode currents.

SUMMARY OF THE INVENTION

The subjects mentioned above are solved by the following radiation noise suppression circuit.

It is a radiation noise suppression circuit for a differential transmission line comprises:

a differential transmission line which has plus line signal wiring to which a plus line signal of a differential signal is applied, and minus line signal wiring to which a minus line signal of said differential signal is applied, and connects a differential driver and a differential receiver;

plus line signal GND wiring and minus line signal GND wiring which are connected between said differential driver and said differential receiver, and are wired along said differential transmission line; and a coil unit in which each of said plus line signal wiring, minus line signal wiring, plus line signal GND wiring, and minus line signal GND wiring is wound in the same winding direction, wherein a distance between said plus line signal wiring and said plus line signal GND wiring is substantially equal to a distance between said minus line signal wiring and said minus line signal GND wiring.

The present invention can provide a radiation noise suppression circuit for a differential transmission line which does not deteriorate a reduction effect of conventional primary common mode currents, and can reduce secondary common mode currents.

BRIEF DESCRIPTION OF THE DRAWINGS

FIG. 8(a) is a perspective view showing appearance of a common mode choke in Japanese Patent Laid-Open No. 2000-58343, and FIG. 8(b) is an exploded perspective view of the common mode choke in the Japanese Patent Laid-Open No. 2000-58343; and FIG. 9(a) is an explanation diagram of common mode currents, and FIG. 9(b) is an explanatory diagram of secondary common mode currents.

DESCRIPTION OF SYMBOLS

Figure 1:
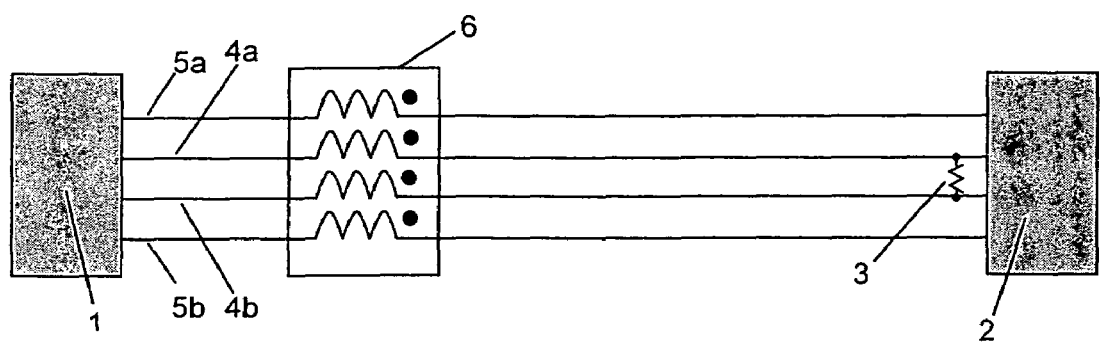
FIG. 1 is a structural diagram of a radiation noise suppression circuit for a differential transmission line in a first embodiment of the present invention.

1 Differential Driver
2 Differential Receiver
3 Terminating Resistor
4a Plus line signal wiring
4b Minus line signal wiring
5a Plus line signal GND wiring
5b Minus line signal GND wiring
6 Four-wire Choke Coil
10 Common Mode Choke
12 Interlayer connection via
26 3-wire Choke Coil
30 Conductor layer
31 Insulation layer

PREFERRED EMBODIMENTS OF THE INVENTION

Hereafter, embodiments of the present invention will be described with referring to drawings.

Embodiment 1

Figure 6:
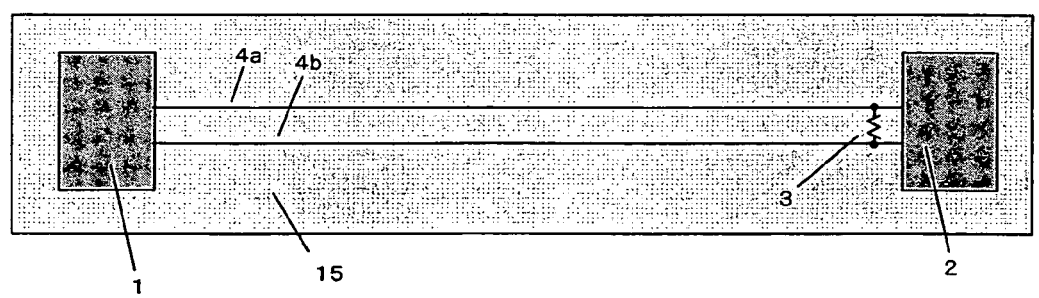
FIG. 6 is a structural diagram of a conventional LVDS system of differential transmission line.
Figure 7:
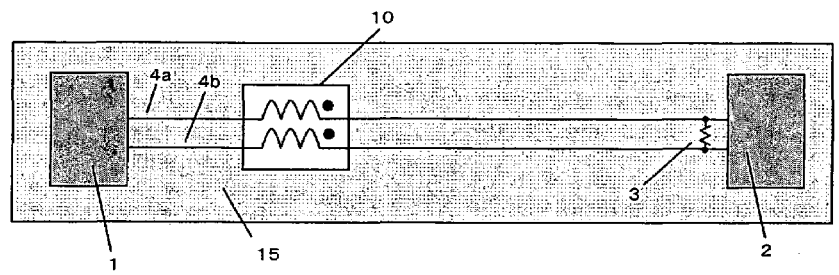
FIG. 7 is a structural diagram of a conventional LVDS system of differential transmission line using a common mode choke.
Figure 7:
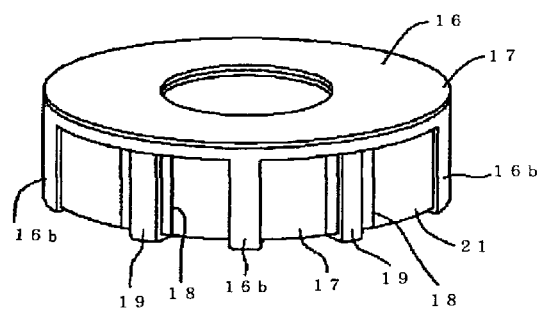
Figure 7:
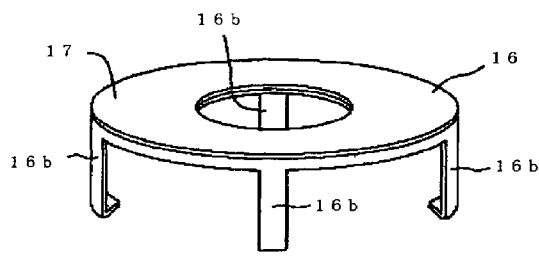
Figure 7:
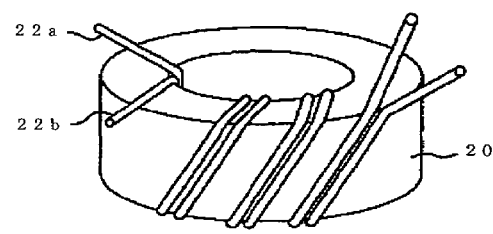
Figure 7:
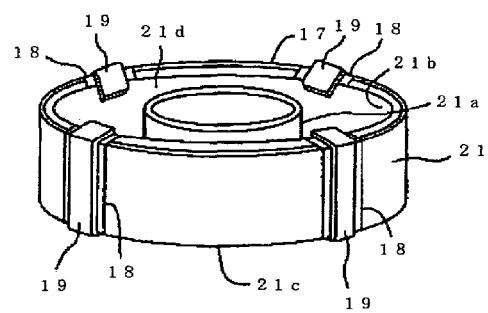

A first embodiment of the present invention will be explained on the basis of FIG. 1. FIG. 1 shows a structural diagram of a radiation noise suppression circuit for a differential transmission line according to this first embodiment. In addition, explanation will be done with using the same reference numerals for the same components as those in FIG. 6.

In FIG. 1, a signal is transmitted to the differential receiver 2 from the differential driver 1 with the plus line signal wiring 4a and the minus line signal wiring 4b. Since electrical characteristics of the plus line signal wiring 4a and the minus line signal wiring 4b are equal, a balanced transmission line is formed, and differential impedance becomes 100 Ω. In addition, near an input terminal of the differential receiver 2, a 100-Ω terminating resistor 3 matched with the differential impedance is connected to the plus line signal wiring 4a and the minus line signal wiring 4b.

In regard to all of the wired signal GND 5a and 5b, a plus line signal GND wiring 5a and a minus line signal GND wiring 5b, as shown in FIG. 1, are arranged so as to sandwich the plus line signal wiring 4a and the minus line signal wiring 4b. At this time, a distance between the plus line signal wiring 4a and plus line signal GND wiring 5a is equal to a distance between the minus line signal wiring 4b and minus line signal GND wiring 5b, and longer than a distance between the plus line signal wiring 4a and minus line signal wiring 4b.

Distances between respective lines of these four lines are maintained wholly between the differential driver 1 and differential receiver 2. Maintenance of the distances between respective lines can be achieved by using, for example, a flat cable.

Figure 2:
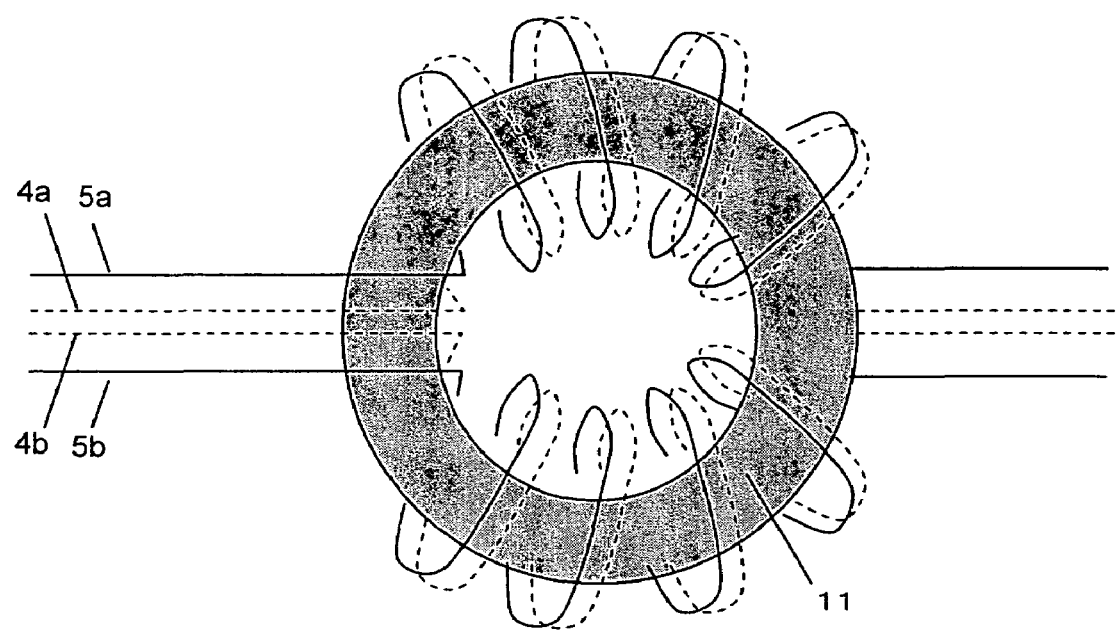
FIG. 2(a) is a structural diagram of a circular four-wire choke coil in a first embodiment of the present invention.
FIG. 2(b) is a structural diagram of a rod-shaped four-wire choke coil in the first embodiment of the present invention.
Figure 2:
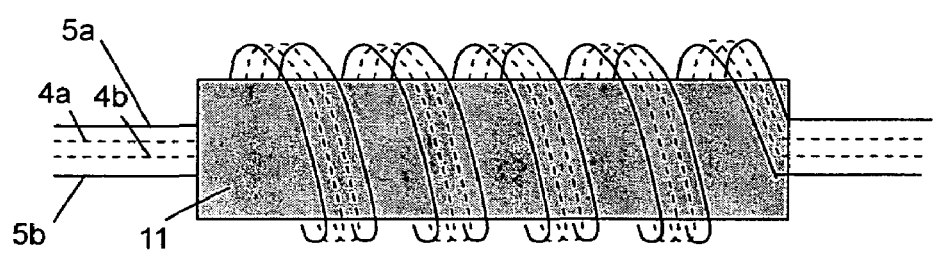

In addition, near an output terminal of the differential driver 1, a four-wire choke coil 6 where four lines are wound around the same core 11 in the same direction as shown in FIG. 2(a) is provided, and the plus line signal wiring 4a, minus line signal wiring 4b, plus line signal GND wiring 5a, and minus line signal GND wiring 5b are connected to this.

FIG. 2(a) shows structure of the four-wire choke coil 6. The four-wire choke coil 6 has a circular core 11, where the plus line signal wiring 4a, minus line signal wiring 4b, plus line signal GND wiring 5a, and minus line signal GND wiring 5b are wound in the same direction.

In addition, the four-wire choke coil 6 is an example of the coil unit of the present invention.

Because of these structure, it is possible to remove the secondary common mode currents which flow through the plus line signal wiring 4a, minus line signal wiring 4b, plus line signal GND wiring 5a, and minus line signal GND wiring 5b in the same direction by the four-wire choke coil 6.

In addition, FIG. 2(b) shows structure of a four-wire choke coil 6 which has a rod-shaped core 11. Thus, what is necessary is just the structure of four wires being wound in the same direction regardless of a shape of the core. For example, although four wires are wound in two sides of the circular core 11 with separating them every two wires in FIG. 2(a), it is also sufficient that it is such structure that the four wires are wound in only the one side.

Furthermore, in the radiation noise suppression circuit of this first embodiment, although the four-wire choke coil 6 is used for noise suppression, the structure without a core is also sufficient.

FIG. 3(a) is a perspective view showing structure of a four-wire coil unit which is another example of the coil unit of the present invention. Even if the four-wire choke coil 6 shown in FIG. 1 is substituted to the structure of the four-wire coil unit shown in FIG. 3(a), the same noise suppression effect can be obtained.

Wiring patterns of a layered substrate achieves the four-wire coil unit of FIG. 3(a). Coiled patterns corresponding to respective plus line signal wiring 4a, minus line signal wiring 4b, plus line signal GND wiring 5a, and minus line signal GND wiring 5b are arranged in different layers in a layered substrate so that they may be stacked vertically. Then, the plus line signal wiring 4a, minus line signal wiring 4b, plus line signal GND wiring 5a, and minus line signal GND wiring 5b are connected to the coiled patterns corresponding to respective wiring with substrate interlayer connection vias 12.

Figure 3:
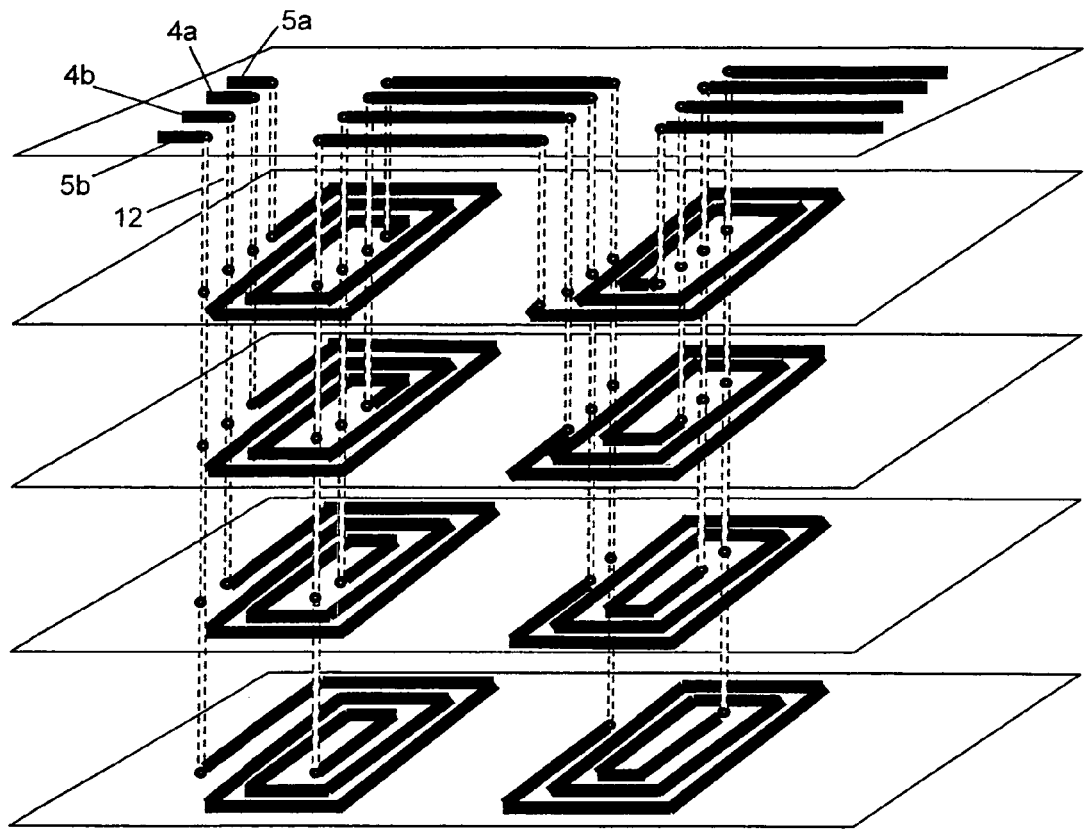
FIG. 3(a) is a perspective view showing a four-wire coil unit which is an example of a noise suppression portion in the first embodiment of the present invention.
FIG. 3(b) is a sectional view showing a four-wire coil unit which is an example of a noise suppression portion in the first embodiment of the present invention.
Figure 3:
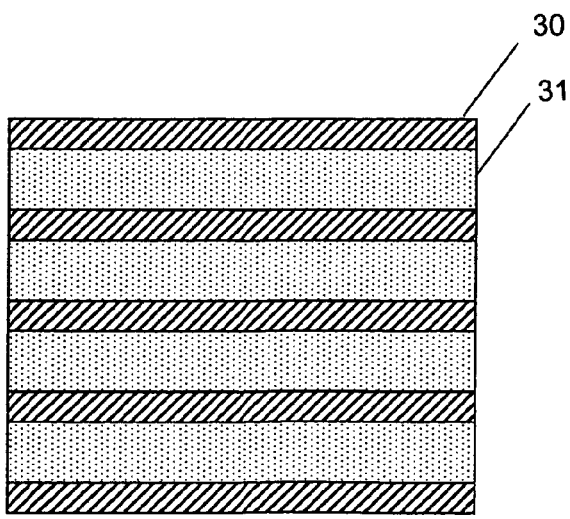

In addition, FIG. 3(b) is a sectional view of FIG. 3(a). A layered substrate is constituted by laminating a conductor layer 30 and an insulation layer 31 turns, and usually, dielectric such as copper is used as a conductor, and FR4 or the like is used as an insulator. According to the configuration of the present invention, the four-wire coil unit shown in FIG. 3 has the same effect as the four-wire choke coil 6 shown in FIG. 1.

Furthermore, in the structure of the four-wire coil unit, it is more preferable to use a magnetic substance as an insulator as the coupling of magnetic fields becomes strong.

When the radiation noise suppression circuit of this first embodiment is connected with the four-wire choke coil 6 after adopting the structure of making a signal ground two wires in wiring in this way, and further sandwiching the signal wiring 4a and 4b with the signal GND wiring 5a and 5b, it becomes possible to reduce the secondary common mode currents without weakening coupling of the signal wiring 4a and 4b, and deteriorating a degree of balance of the wiring.

In addition, because of such structure that the distance between the plus line signal GND wiring 5a and the plus line signal wiring 4a becomes equal to the distance between the minus line signal GND wiring 5b and the minus line signal wiring 4b, and that the distance between the plus line signal wiring 4a and the minus line signal wiring 4b becomes shorter than the distance between the plus line signal GND wiring 5a and the plus line signal wiring 4a, and the distance between the minus line signal GND wiring 5b and the minus line signal wiring 4b, it becomes possible to strengthen the coupling of the signal wiring 4a and 4b and to prevent deterioration of the degree of balance.

Moreover, when inventing the radiation noise suppression circuit of the present invention, the present inventors also studied a method of using for LVDS a common mode filter for TMDS (Transition Minimized Differential Signaling) where three wires including a signal ground for TMDS which is one of differential transmission systems were wound around a coil.

Since the TMDS system is theoretically a pseudo-differential transmission system which flows a signal by turns on between one signal wiring and signal ground wiring, and on between another signal wiring and signal ground wiring, there is no problem even if the signal ground wiring is arranged between the two signal lines.

Contents of these analyses will be explained below as a comparative example.

COMPARATIVE EXAMPLE 1

Figure 4:
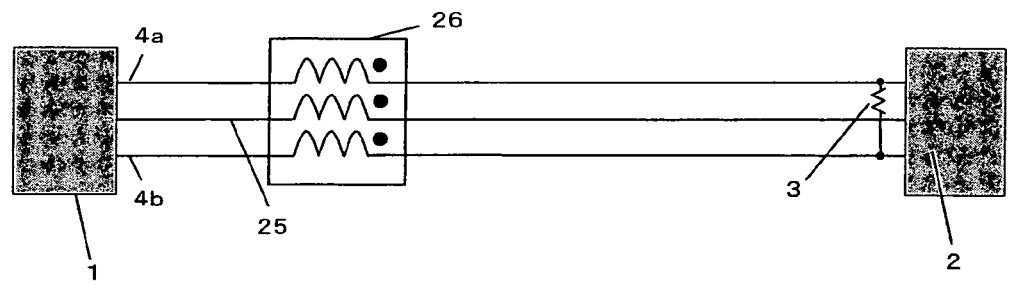
FIG. 4 is a structural diagram of a differential transmission circuit of a comparative example 1 where a common mode filter for TMDS is applied to LVDS.

FIG. 4 shows a structural diagram of a differential transmission circuit at the time of arranging signal GND between signal wiring. In addition, the same reference numerals are used for the same components as those in FIG. 6.

As shown in FIG. 4, wired signal GND 25 was arranged between the two signal wiring 4a and 4b between the differential driver 1 and the differential receiver 2. Then, a three-wire choke coil 26 was provided near an output terminal of the differential driver 1, and it had the structure that three wires of the two signal wiring 4a and 4b, and signal GND wiring 25 were wound in the same direction. Here, a choke coil having the structure that three wires were wound around the core 11 of a choke coil as shown in FIG. 2(a) was used for the three-wire choke coil 26.

Thus, a new subject found was that, when the signal GND wiring 25 was arranged between the two signal wiring 4a and 4b, a waveform was distorted because the coupling of the signal wiring 4a and 4b became weaker, and noise increased because reflection arose due to a change of a differential impedance.

COMPARATIVE EXAMPLE 2

Figure 5:
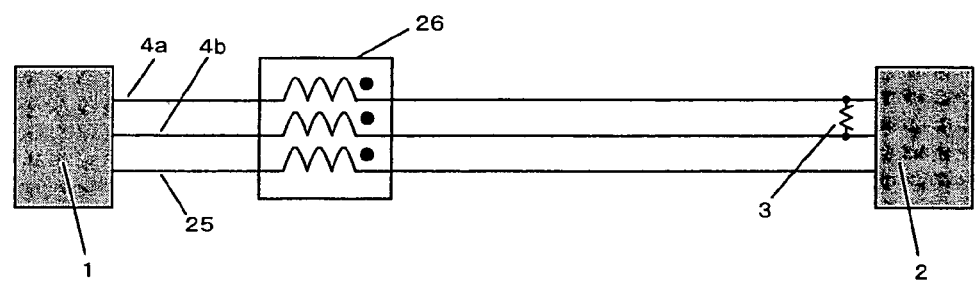
FIG. 5 is a structural diagram of a differential transmission circuit of a comparative example 2 where a common mode filter for TMDS is applied to LVDS.

FIG. 5 shows a structural diagram of a differential transmission circuit at the time of arranging signal GND outside the two signal wiring. In addition, the same reference numerals are used for the same components as those in FIG. 4.

Although the signal GND wiring 25 was arranged between the two signal wiring 4a and 4b in the comparative example 1, comparative example 2 had the structure that the signal GND wiring 25 was arranged outside the two signal wiring 4a and 4b.

A new subject found was that, when the signal GND wiring 25 was arranged outside the two signal wiring 4a and 4b, radiation noise by the primary common mode current deteriorated because of deterioration of the degree of balance of wiring since respective distances between the signal wiring 4a and 4b, and the signal GND wiring 25 differed.

On the other hand, in the radiation noise suppression circuit of the present invention, radiation noise by the primary common mode current does not also deteriorate since there arises no deterioration of the degree of balance of wiring which arises in the structure that one signal GND wiring 25 as shown in FIG. 5 is arranged outside either of the two signal wiring 4a and 4b by the plus line signal GND wiring 5a and minus line signal GND wiring 5b being arranged so as to sandwich the plus line signal wiring 4a and minus line signal wiring 4b, as shown in FIG. 1.

Although the noise radiation by the secondary common mode current was reduced when the common mode filter for TMDS was applied to LVDS as it was as shown in the comparative example 1 and comparative example 2, there arose a new subject that the noise radiation by the primary common mode current deteriorated.

The radiation noise suppression circuit of the present invention can reduce the noise radiation by the secondary common mode current for these comparative examples without deteriorating the noise radiation by the primary common mode current.

As explained above, the radiation noise suppression circuit for a differential transmission line according to the present invention can reduce the secondary common mode current which flows through a signal line and a GND line in the same direction and could not decrease with a conventional common mode choke in a differential transmission line which is one of high speed signal transmission systems, and can prevent the deterioration of a conventional reduction effect of the primary common mode current.

The radiation suppression circuit for a differential transmission line according to the present invention is useful in a differential transmission system, which is one of the high speed signal transmission systems, on the design of a differential transmission line which hardly outputs radiation noise. Therefore, signal transmission with radiation noise suppressed can be realized.

What is claimed is:

1. A radiation noise suppression circuit for a differential transmission line, comprising:
   a differential transmission line which has plus line signal wiring to which a plus line signal of a differential signal is applied, and minus line signal wiring to which a minus line signal of said differential signal is applied, and connects a differential driver and a differential receiver;
   plus line signal ground wiring and minus line signal ground wiring which are connected between said differential driver and said differential receiver, and are wired along said differential transmission line; and
   a coil unit in which each of said plus line signal wiring, said minus line signal wiring, said plus line signal ground wiring, and said minus line signal ground wiring is wound in a common winding direction,
   wherein a distance between said plus line signal wiring and said plus line signal ground wiring is substantially equal to a distance between said minus line signal wiring and said minus line signal ground wiring,
   said plus line signal wiring and said minus line signal wiring are arranged so as to be sandwiched between said plus line signal ground wiring and said minus line signal ground wiring, and
   a distance between said plus line signal wiring and said minus line signal wiring is shorter than a distance between said plus line signal wiring and said plus line signal around wiring.

2. The radiation noise suppression circuit for a differential transmission line according to claim 1, wherein said plus line signal wiring, said minus line signal wiring, and said signal ground wiring include respective coil-shaped portions which are stacked so the coil-shaped portions are in the common winding direction.

3. The radiation noise suppression circuit for a differential transmission line according to claim 2, wherein each of said plus line signal wiring, said minus line signal wiring, said plus line signal ground wiring, and said minus line signal ground wiring are on respectively different layers of a layered substrate.

4. The radiation noise suppression circuit for a differential transmission line according to claim 1, wherein said coil unit is a four-wire choke coil; and
   wherein each of said plus line signal wiring, said minus line signal wiring, said plus line signal ground wiring, and said minus line signal ground wiring are wound around a common core of the four-wire choke coil in the same direction.

5. The radiation noise suppression circuit for a differential transmission line according to claim 1, wherein mutual distances between said plus line signal wiring, said minus line signal wiring, said plus line signal ground wiring, and said minus line signal ground wiring are kept wholly between said differential driver and said differential receiver.

* * * * *